US010546823B2

(12) United States Patent
Pathangey et al.

(10) Patent No.: US 10,546,823 B2
(45) Date of Patent: Jan. 28, 2020

(54) APPARATUS AND METHOD FOR MITIGATING SURFACE IMPERFECTIONS ON DIE BACKSIDE FILM USING FLUOROCARBON MATERIAL

(71) Applicant: INTEL CORPORATION, Santa Clara, CA (US)

(72) Inventors: Balu Pathangey, Socttsdale, AZ (US); Mihir A. Oka, Chandler, AZ (US); Andrew Proctor, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/767,306

(22) PCT Filed: Nov. 13, 2015

(86) PCT No.: PCT/US2015/060649
§ 371 (c)(1),
(2) Date: Apr. 10, 2018

(87) PCT Pub. No.: WO2017/082926
PCT Pub. Date: May 18, 2017

(65) Prior Publication Data
US 2019/0067213 A1    Feb. 28, 2019

(51) Int. Cl.
*H01L 23/00*     (2006.01)
*H01L 21/67*     (2006.01)
(Continued)

(52) U.S. Cl.
CPC ...... *H01L 23/562* (2013.01); *H01L 21/67132* (2013.01); *H01L 21/6836* (2013.01);
(Continued)

(58) Field of Classification Search
CPC ...... H01L 23/562; H01L 23/564; H01L 23/58
See application file for complete search history.

(56) References Cited

U.S. PATENT DOCUMENTS

| 5,443,941 A | 8/1995 | Bariya et al. |
| 2007/0085225 A1* | 4/2007 | Mengel ............... H01L 23/3121 257/792 |

(Continued)

FOREIGN PATENT DOCUMENTS

| JP | 2014187353 | 10/2014 |
| KR | 20150126133 | 11/2015 |

OTHER PUBLICATIONS

International Search Report and Written Opinion for PCT Application No. PCT/US15/60649 dated Aug. 11, 2016, 14 pages.

(Continued)

*Primary Examiner* — Quoc D Hoang
(74) *Attorney, Agent, or Firm* — Green, Howard & Mughal LLP.

(57) ABSTRACT

Described is an apparatus which comprises: a die having a first side and a second side opposite to the first side; a die backside film (DBF) or die attach film (DAF) disposed over the first side of the die; and a fluorocarbon layer disposed over the DBF or DAF. Described is a method which comprises: applying a die backside film (DBF) over a first side of a die, wherein the die has a second side which metal bumps; and applying a plasma polymerization process to treat the DBF with a fluorocarbon plasma.

13 Claims, 9 Drawing Sheets

(51) Int. Cl.
  *H01L 21/683* (2006.01)
  *H01L 21/78* (2006.01)
  H01L 25/065 (2006.01)
  H01L 25/18 (2006.01)

(52) U.S. Cl.
  CPC ............ *H01L 21/78* (2013.01); *H01L 23/564* (2013.01); *H01L 25/0657* (2013.01); *H01L 25/18* (2013.01); *H01L 2221/6834* (2013.01); *H01L 2221/68327* (2013.01); *H01L 2225/06513* (2013.01); *H01L 2225/06582* (2013.01)

(56) References Cited

U.S. PATENT DOCUMENTS

| | | | |
|---|---|---|---|
| 2011/0263097 A1 | 10/2011 | Yoshimura et al. | |
| 2014/0231815 A1 | 8/2014 | Railkar et al. | |
| 2014/0231983 A1 | 8/2014 | Sugo et al. | |
| 2015/0279819 A1* | 10/2015 | Lee | H01L 23/3157 257/737 |
| 2015/0318226 A1 | 11/2015 | Baek et al. | |
| 2016/0130136 A1* | 5/2016 | Singh | B81C 1/00309 257/415 |

OTHER PUBLICATIONS

International Preliminary Report on Patentability for PCT Application No. PCT/US15/60649, dated May 24, 2018.

\* cited by examiner

APPARATUS AND METHOD FOR MITIGATING SURFACE IMPERFECTIONS ON DIE BACKSIDE FILM USING FLUOROCARBON MATERIAL

CLAIM OF PRIORITY

This Application is a National Stage Entry of, and claims priority to, PCT Application No. PCT/US15/60649, filed on 13 Nov. 2015 and entitled "APPARATUS AND METHOD FOR MITIGATING SURFACE IMPERFECTIONS ON DIE BACKSIDE FILM," which is incorporated by reference in its entirety for all purposes.

BACKGROUND

Stains on a Die Backside Film (DBF) and the DBF sticking to a cover tape are major issues in semiconductor die handling, packaging, and marker identifying. These stains and the DBF stickiness result in yield losses at assembly operations downstream from die preparation (or die singulation from the wafer level). Semiconductor die manufacturers apply the DBF for die crack protection and for laser marking. Newer integrated circuit (IC) packaging technologies, such as emerging Bumpless Build-Up Layer (BBUL) technology, need DBF formulation without any fillers. The no filler DBF has higher risk of sticking to a cover tape due to increased DBF tackiness. The higher moisture content in no filler DBF also increases the risk of having higher frequency for the formation of larger size voids and/or bubbles post DBF cure. These types of defects or stains on the DBF also result in poor laser mark contrast.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
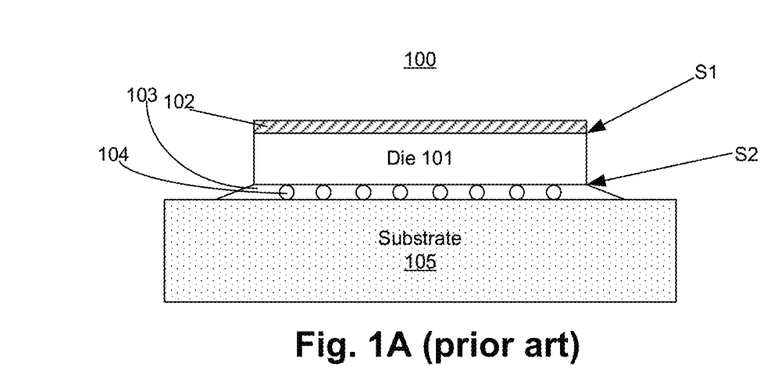
FIG. 1A illustrates a cross-section of a die with Die Backside Film (DBF).

Lower molecular weight organic components in Die Backside Film (DBF) are believed to be the leading causes for stains on the DBF. FIG. 1A illustrates cross-section 100 of a die with a DBF. This simplified cross-section shows a typical application of a DBF on a die. Here, cross-section 100 shows Die 101 (e.g., a processor) having two surfaces (or sides) S1 and S2, where side S1 is opposite of die S2. Side S1 is the backside of Die 101 while side S2 is the front side of Die 101. The backside of Die 101 has a layer of DBF 102. Any known material can be used for forming DBF 102. For example, epoxy, epoxy acrylate, acrylic resin based, epoxy-maleimides, polyimide, vinyl ester, etc may be used for forming DBF 102. DBF 102 is a tape material which is used for die laser marking. DBF 102 also protects Die 101 from cracking. The front side of Die 101 is coupled to Substrate 105 (e.g., organic substrate) via interconnects 104 (e.g., solder balls forming a first level interconnect (FLI)). The region between Substrate 105 and Die 101 is under-fill 103 (e.g., epoxy)

Figure 1B:
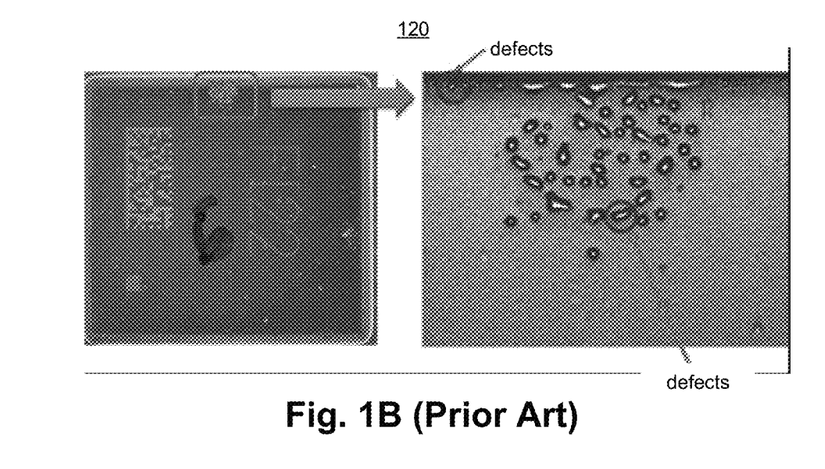
FIG. 1B illustrates an image (and its zoomed version) with stains on the DBF due to interaction with a cover tape on die units.

FIG. 1B illustrates image 120 (and its partially zoomed version) with stains on DBF 102 due to an interaction of a cover tape and due to low molecular weight components leaching out of the bulk DBF on die units. It is pointed out that those elements of FIG. 1B having the same reference numbers (or names) as the elements of any other figure can operate or function in any manner similar to that described, but are not limited to such.

The image to the left is of the backside of Die 101 with a layer of DBF 102, while the image to the right is the zoomed version of the stains on DBF 102. Residual moisture content and low viscosity of DBF 102 formulation and leaching out of the lower molecular weight components are believed to be the leading causes for stains/surface defects on DBF 102.

The stains or defects on DBF 102 can change the contrast of DBF 102 such that the markings DBF 102 can become unreadable. These stains can also be caused by gases or chemicals escaping Die 101 and getting trapped under DBF 102. Eventually, these gases or chemicals make the surface of DBF 102 rough. The stains on the surface of DBF 102 are local defects and can cause local increase in the adhesion of DBF 102. For example, the local defects may cause DBF 102 to attach with a cover tape. This localized increase in adhesion between DBF 102 and the cover tape can lead to die cracking during removal of the die from tape-and-reel. The stains/bubbles/voids on DBF 102 surface post cure introduce background noise or quality risk and decrease laser mark readability.

Figure 1C:
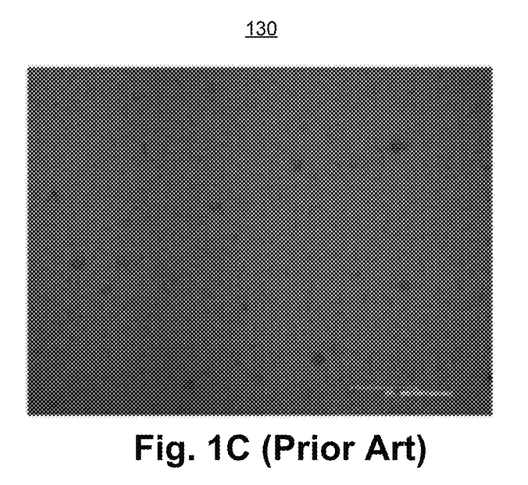
FIG. 1C illustrates an optical microscopy image of a filled DBF post cure.

FIG. 1C illustrates an optical microscopy image 130 of a filled DBF post cure. It is pointed out that those elements of FIG. 1C having the same reference numbers (or names) as the elements of any other figure can operate or function in any manner similar to that described, but are not limited to such. After completing the curing process (which involves a high temperature process), voids and stains begin to appear on DBF 102.

Figure 1D:
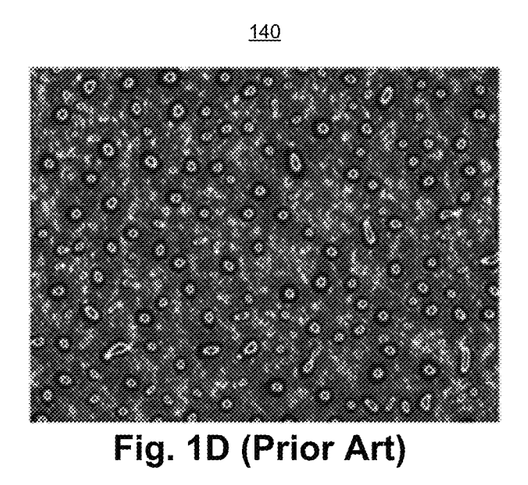
FIG. 1D illustrates an optical microscopy image of an unfilled DBF post cure.

FIG. 1D illustrates an optical microscopy image 140 of an unfilled DBF post cure. It is pointed out that those elements of FIG. 1D having the same reference numbers (or names) as the elements of any other figure can operate or function in any manner similar to that described, but are not limited to such. After the curing process (which involves a high temperature process), voids and stains begin to appear on DBF 102. Here, compared to image 130, the stains and voids are numerous. The unfilled DBF sample of FIG. 1D has larger size voids and higher void frequency compared to filled DBF samples of FIG. 1C.

The stains may be formed because of residual solvent/ moisture diffusing from bulk to film surface when DBF 102 is exposed to high temperature (e.g., reflow during chip attach to substrate, during underfill cure, etc.). Stains can also form due to moisture or other low molecular weight organic species (e.g., slip agents, getting transferred to the DBF surface and reacting with components leaching out of DBF 102). Uncured DBF is prone to stick to other adhesive or polymer films (e.g. cover tapes). This results in yield loss due to the silicon die with DBF adhering strongly to the polymer film in contact.

Figure 1E:
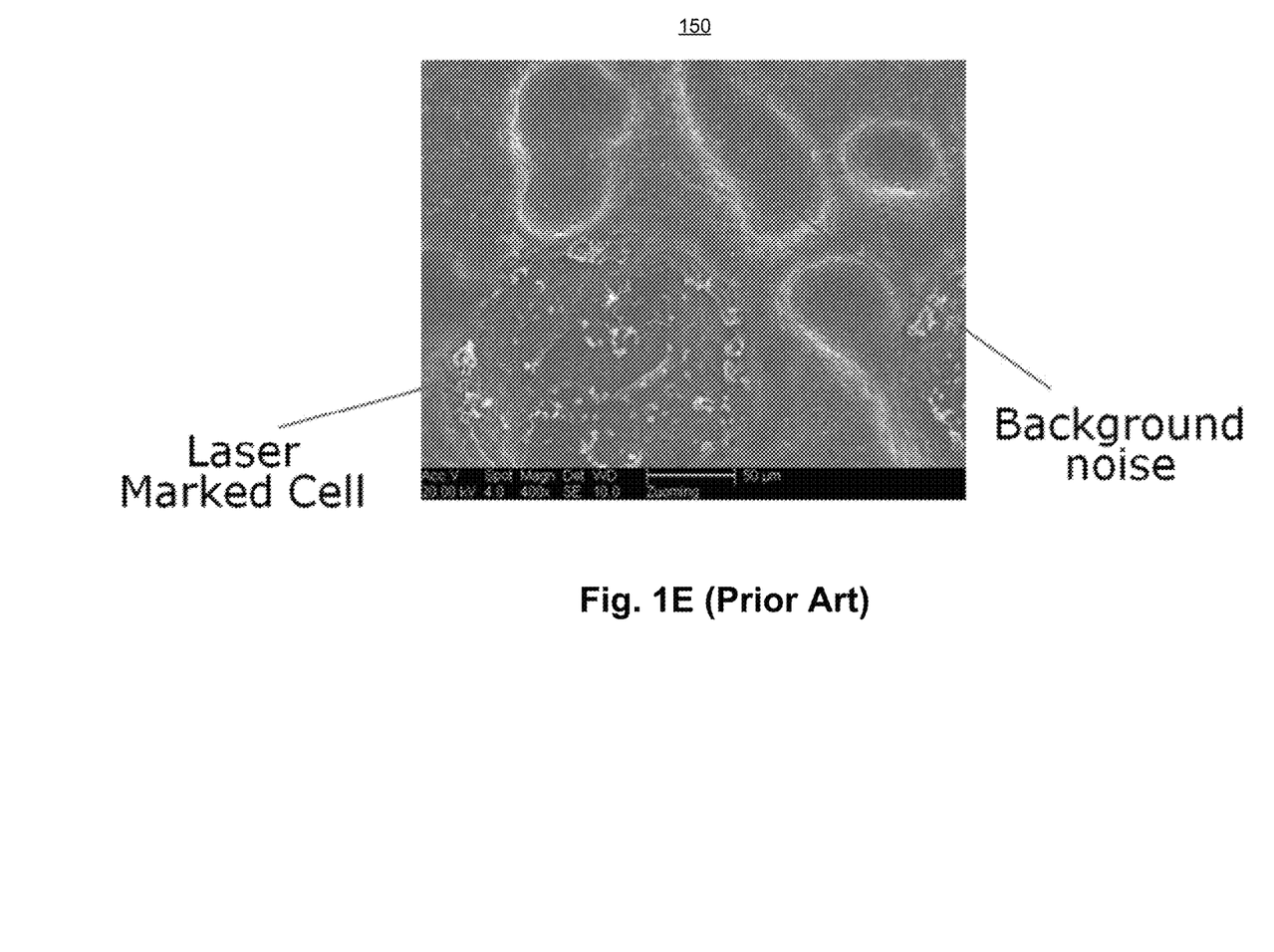
FIG. 1E illustrates a Scanning Electron Microscopy (SEM) image of a laser marked die sample with no filler DBF.

FIG. 1E illustrates a Scanning Electron Microscopy (SEM) image 150 of a laser marked die sample with no filler DBF. Image 150 clearly shows the difficulty in reading the laser marking due to the stains and voids (same as background noise). The stains/bubbles/voids on DBF surface post cure introduce background noise and decrease laser mark readability.

Thermal Gravimetric Analysis or Thermogravimetric analysis (TGA) data shows that the no filler DBF samples have higher residual solvent content than filler DBF samples. TGA is a method of thermal analysis in which changes in physical and chemical properties of materials are measured as a function of increasing temperature with constant heating rate. TGA is also a method of thermal analysis in which changes in physical and chemical properties of materials are measured as a function of time with constant temperature and/or constant mass loss. Gas Chromatography analysis shows organic ketones to be the major outgassing component that causes stains/bubbles/voids to show up on DBF 102, for example.

Various embodiments solve at least the above problem(s) by modifying the DBF surface to prevent residual solvent and other volatile organics from leaching out to the DBF surface. In some embodiments, the voids/bubbles/stains on the DBF surface are eliminated or minimized (e.g., reduced) through chemical treatment using a dry or wet process. In some embodiments, uncured DBF is treated with fluorocarbon plasma e.g., $CF_4$ (tetrafluoro-methane) or $CHF_3$ (trifluoro-methane) or $C_2F_6$ (hexafluoro-ethane) or $C_4F_8$ (octafluoro-butane) resulting in modification of the DBF surface. In other embodiments, any organic monomer containing fluoro group can be used as fluorocarbon plasma.

In some embodiments, a thin fluorocarbon film (e.g., less than 10 nm thickness) is deposited over the DBF surface. This film acts as a barrier layer and is a membrane-like film that prevents violent release of residual solvents through the DBF surface, in accordance with some embodiments. This results in smooth DBF surface that is free of voids or bubbles, in one example. The barrier layer thickness can be controlled by varying exposure time, in accordance with some embodiments. In some embodiments, the barrier layer (e.g., fluorocarbon film) is deposited on any polymeric film to prevent moisture or other organic species from migrating in or out of the film surface.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

Figure 2:
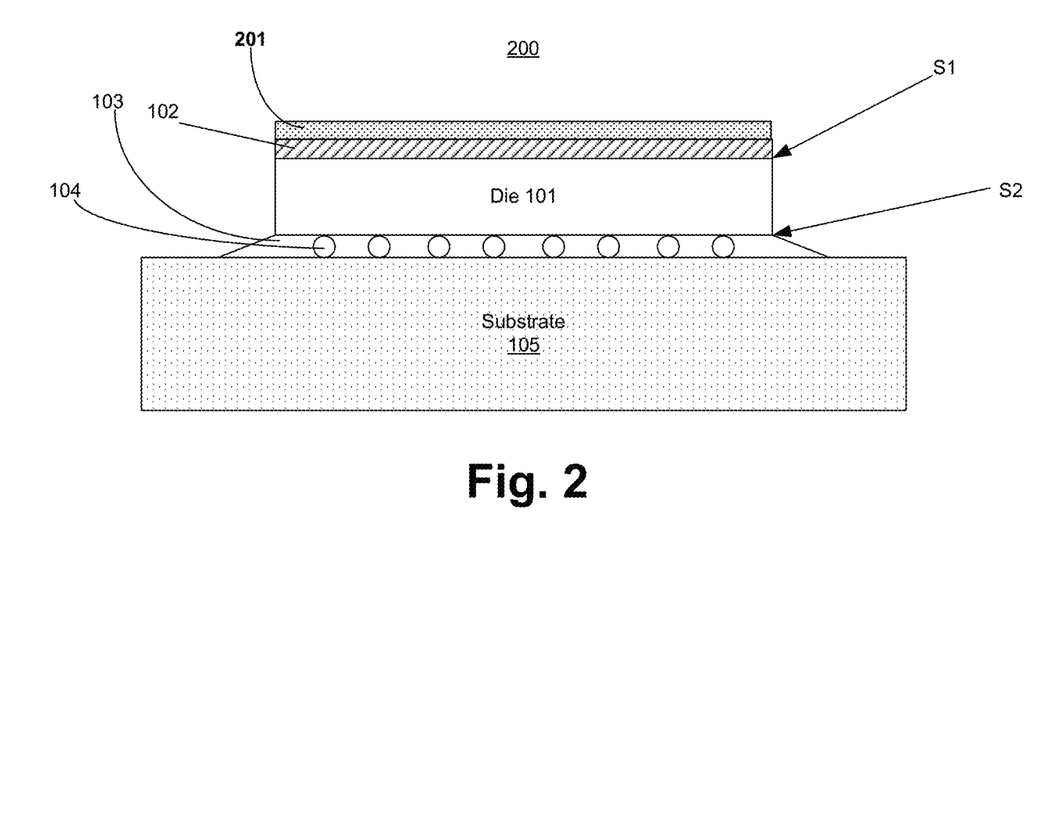
FIG. 2 illustrates a cross-section of a die with DBF treated with a layer of fluorocarbon, in accordance with some embodiments of the disclosure.

FIG. 2 illustrates cross-section 200 of a die with DBF treated with a layer of fluorocarbon, in accordance with some embodiments of the disclosure. It is pointed out that those elements of FIG. 2 having the same reference numbers (or names) as the elements of any other figure can operate or function in any manner similar to that described, but are not limited to such. So as not to obscure the embodiments, differences between FIG. 1 and FIG. 2 are described.

In some embodiments, a layer of fluorocarbon 201 is deposited over DBF 102. In some embodiments, the layer of fluorocarbon 201 has a thickness in the range of 1 nm to 10 nm. In some embodiments, the thickness of the layer of fluorocarbon 201 is thin enough for Die 101 not to adhere to a cover tape and enables removal of the die from tape-and-reel after removal of the cover tape. In some embodiments, the layer of fluorocarbon 201 is formed of one of: $CF_4$ (tetrafluoro-methane), $CHF_3$ (trifluoro-methane), $C_2F_6$ (hexafluoro-ethane) or $C_4F_8$ (octafluoro-butane), etc. In other embodiments, any organic monomer containing fluoro group can be used as fluorocarbon layer 201. In some embodiments, the layer of fluorocarbon 201 is formed over DBF 102 by plasma polymerization process (or glow discharge polymerization).

Plasma polymerization process uses plasma sources to generate a gas discharge. This gas discharge provides energy to activate or fragment gaseous or liquid monomer, often containing an organic compound, to initiate polymerization. Polymers formed from plasma polymerization are generally highly branched and highly cross-linked, and adhere to solid surfaces well. As such, a thin layer of fluorocarbon 201 can adhere to DBF 102 and other surfaces such as solder balls and molds. One advantage of plasma polymerization is that polymers can be directly attached to a desired surface while the polymer chains are growing. As such, the processing steps necessary for other coating processes such as grafting are reduced.

In some embodiments, an uncured DBF is laminated on bare silicon die(s) and then treated with either $CF_4$ or $CHF_3$ gases ionized along under plasma fields generated from an industry standard radio frequency plasma generation system. In some embodiments, the treated DBF samples are cured and inspected using optical microscopy.

Figure 3:
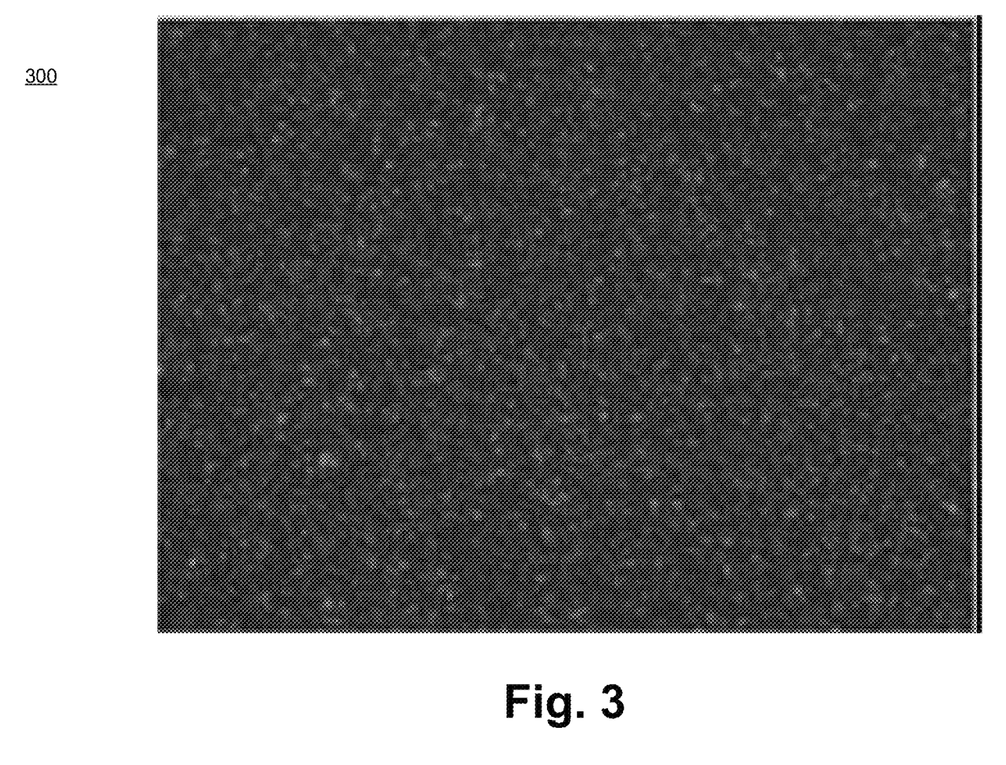
FIG. 3 illustrates an optical microscopy image of an unfilled DBF which is fluorocarbon plasma treated, in accordance with some embodiments.

FIG. 3 illustrates an optical microscopy image 300 of an unfilled DBF which is fluorocarbon plasma treated, in accordance with some embodiments. Comparing image 300 with image 140, DBF 102 surface remains smooth (e.g., no voids) post cure after fluorocarbon layer 201 is deposited. In some embodiments, fluorocarbon layer 201 not only acts as a barrier for gasses and chemicals trying to come out through DBF 102, fluorocarbon layer 201 also protects Die 101 from external elements such as moisture. The smooth surface of DBF 102 allows the cover tape to come off without impacting Die 101.

Figure 4:
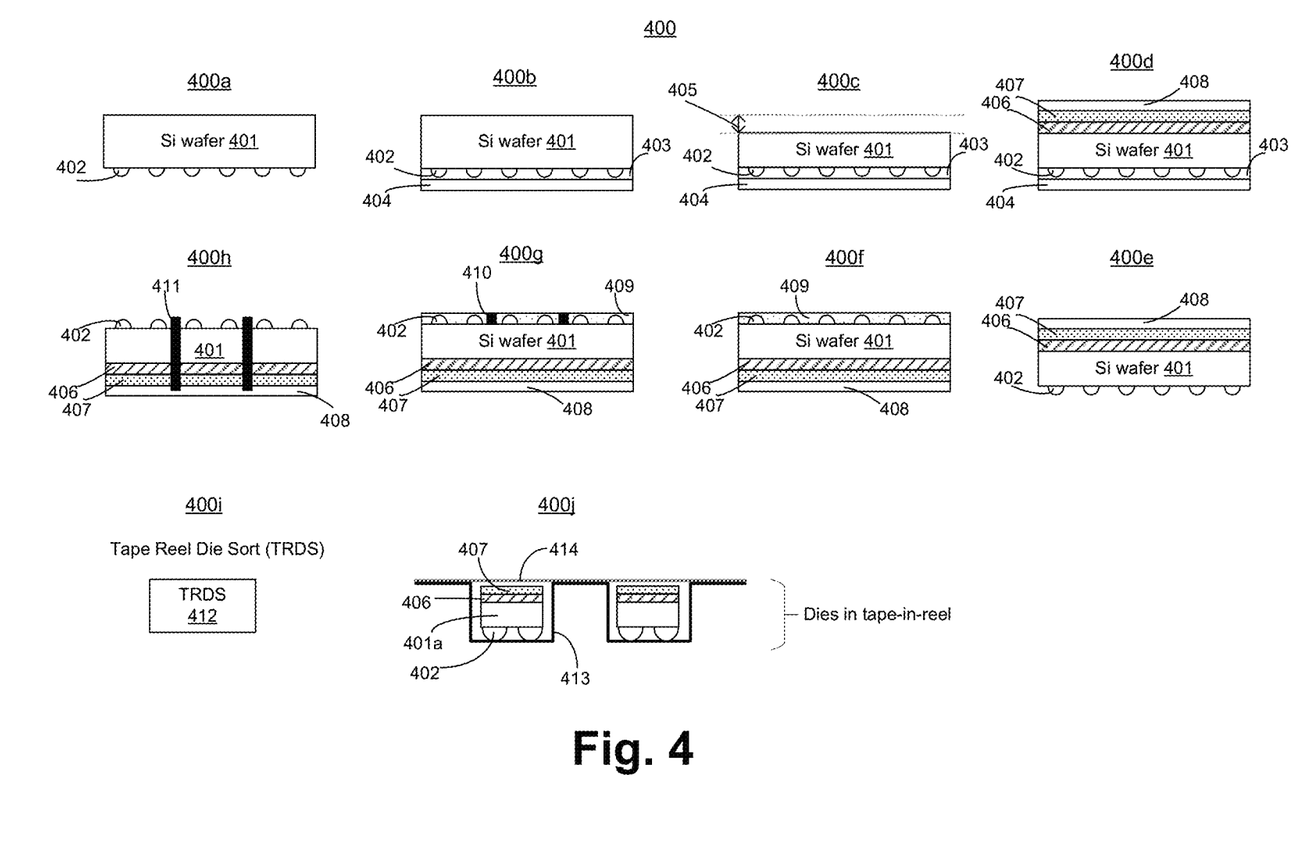
FIG. 4 illustrates a process flow in the form of a plurality of cross-sections of a die to prepare the die(s) for tape-in-reel, where the die has a DBF treated with a layer of fluorocarbon, in accordance with some embodiments of the disclosure.

FIG. 4 illustrates a process flow 400 in the form of a plurality of cross-sections of a die to prepare the die(s) for tape-and-reel, where the die has a DBF treated with a layer of fluorocarbon, in accordance with some embodiments of the disclosure. It is pointed out that those elements of FIG. 4 having the same reference numbers (or names) as the elements of any other figure can operate or function in any manner similar to that described, but are not limited to such.

Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Cross-section 400a illustrates Silicon (Si) wafer 401 (e.g., a plurality of processor dies 101) with metal bumps 402. Si wafer 401 is an incoming bumped wafer. Cross-section 400b shows the deposition of a base film of back grinding (BG) tape 404 over an interface layer 403. In some embodiments, interface layer 403 may be, or may include, a layer of under-fill, adhesive, dielectric, or other material. In some embodiments, interface layer 403 may serve various functions, such as providing mechanical strength, conductivity, heat dissipation, or adhesion. Cross-section 400c illustrates Si wafer 401 after being thinned. Here, 405 indicates the height reduction of Si wafer 401 after the thinning process.

Cross-section 400d shows deposition of DBF 406 (e.g., DBF 102) over Si wafer 401. In some embodiments, DBF 406 or Die Attach Film (DAF) is laminated on the backside of the Si wafer followed by surface modification of the uncured DBF or DAF surface via a plasma treatment.

In some embodiments, after a curing process (e.g., heating DBF 406 to 180° C. for a couple hours), a plasma polymerization process is performed to form a layer of fluorocarbon layer 407 (e.g., fluorocarbon layer 201) over DBF 406. In some embodiments, dicing tape 408 is mounted over fluorocarbon layer 407. In some embodiments, DBF 406 is combined with dicing tape 408 in a 2-in-1 type of tape construction. In some embodiments, plasma polymerization process is performed to form a layer of fluorocarbon layer 407 (e.g., fluorocarbon layer 201) over DBF 406 after removal of dicing tape 408 in post wafer singlulation step.

Cross-section 400e shows the removal of BG tape 404. Cross-section 400f shows wafer coating 409 applied over interface layer 403. Cross-section 400g shows the laser scribe 410 for dicing Si wafer 401 into radices or dies (e.g., processor dies). Cross-section 400h shows the sawing regions 411 of Si wafer 401 along laser scribes 410. Cross-section 400i captures the Tape Reel Die Sort (TRDS) process 412. Cross-section 400j shows the process of placing singulated dies in tape-and-reel (or tape-n-reel) 413 after picking up the dies from the wafer. Cross-section 400j also shows the process of mounting cover tape 414 over fluorocarbon layer 407, in accordance with some embodiments. Upon dicing of Si wafer 401, a plurality of dies are formed (e.g., 401a). Here, fluorocarbon layer 407 prevents voids and bumps from being formed on DBF 406.

Figure 5:
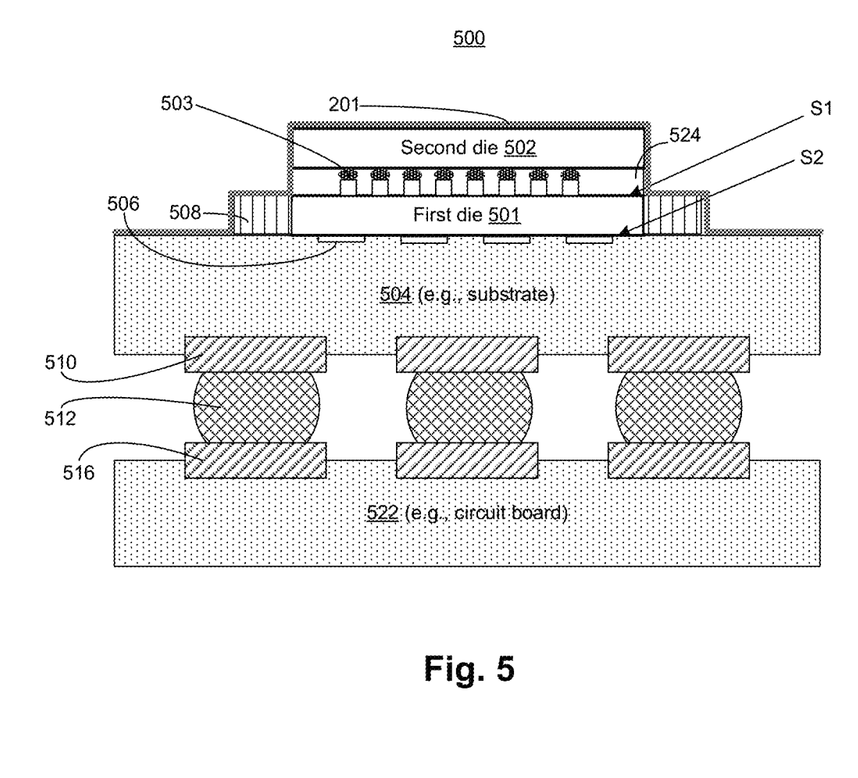
FIG. 5 illustrates a cross-sectional view of an integrated circuit (IC) package assembly treated with a layer of fluorocarbon, in accordance with various embodiments

FIG. 5 illustrates cross-sectional view 500 of an integrated circuit (IC) package assembly treated with a layer of fluorocarbon, in accordance with various embodiments. It is pointed out that those elements of FIG. 5 having the same reference numbers (or names) as the elements of any other figure can operate or function in any manner similar to that described, but are not limited to such.

In some embodiments, IC package assembly may include First die 501, package substrate 504, and circuit board 522.

IC package assembly of cross-sectional view 500 is one example of a stacked die configuration in which First die 501 is coupled to package substrate 504, and Second die 502 is coupled with First die 501, in accordance with some embodiments.

In some embodiments, First die 501 may have a first side S1 and a second side S2 opposite to the first side S1. In some embodiments, the first side S1 may be the side of the die commonly referred to as the "inactive" or "back" side of the die. In some embodiments, the second side S2 may include one or more transistors, and may be the side of the die commonly referred to as the "active" or "front" side of the die. In some embodiments, second side S2 of First die 501 may include one or more electrical routing features 506. In some embodiments, second die 502 may include an "active" or "front" side with one or more electrical routing features 506. In some embodiments, electrical routing features 506 may be bond pads (e.g., formed from a combination of bumps 502a and solder balls 503a).

In some embodiments, Second die 502 may be coupled to First die 501 in a front-to-back configuration (e.g., the "front" or "active" side of Second die 502 is coupled to the "back" or "inactive" side S1 of First die 501). In some embodiments, dies may be coupled with one another in a front-to-front, back-to-back, or side-to-side arrangement. In some embodiments, one or more additional dies may be coupled with First die 501, Second die 502, and/or with package substrate 504. Other embodiments may lack Second die 502. In some embodiments, First die 501 may include one or more through-silicon vias (TSVs).

In some embodiments, Second die 502 is coupled to First die 501 by die interconnects formed from combination of bumps and solder balls 503. In some embodiments, solder balls 503 are formed using the solder-on-die (SOD) process. In some embodiments, a layer of fluorocarbon (e.g., layers 201/407) is deposited on solder balls 503. In some embodiments, a layer of fluorocarbon (e.g., layers 201/407) is deposited on S2 of First die 501.

In some embodiments, inter-die interconnects may be solder bumps, copper pillars, or other electrically conductive features. In some embodiments, an interface layer 524 may be provided between First die 501 and Second die 502. In some embodiments, interface layer 524 may be, or may include, a layer of under-fill, adhesive, dielectric, or other material. In some embodiments, interface layer 524 may serve various functions, such as providing mechanical strength, conductivity, heat dissipation, or adhesion.

In some embodiments, First die 501 and Second die 502 may be single dies (e.g., First die 501 is a single die instead of multiple dies). In other embodiments, First die 501 and/or Second die 502 may include two or more dies. For example, in some embodiments First die 501 and/or Second die 502 may be a wafer (or portion of a wafer) having two or more dies formed on it. In some embodiments, First die 501 and/or Second die 502 includes two or more dies embedded in an encapsulant. In some embodiments, the two or more dies are arranged side-by-side, vertically stacked, or positioned in any other suitable arrangement. In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

In some embodiments, First die 501 and/or Second die 502 may be a primary logic die. In some embodiments, First die 501 and/or Second die 502 may be configured to function as memory, an application specific circuit (ASIC), a processor, or some combination of such functions. For example, First die 501 may include a processor and Second die 502 may, include memory. In some embodiments, one or both of First die 501 and Second die 502 may be embedded in encapsulant 508. In some embodiments, encapsulant 508 can be any suitable material, such as an Ajinomoto Build-up Film (ABF) substrate, other dielectric/organic materials, resins, epoxies, polymer adhesives, silicones, acrylics, polyimides, cyanate esters, thermoplastics, and/or thermosets.

In some embodiments, First die 501 may be coupled to package substrate 504. In some embodiments, package substrate 504 may be a coreless substrate. For example, package substrate 504 may be a bumpless build-up layer (BBUL) assembly that includes a plurality of "bumpless" build-up layers. Here, the term "bumpless build-up layers" generally refers to layers of substrate and components embedded therein without the use of solder or other attaching means that may be considered "bumps."

In some embodiments, the one or more build-up layers may have material properties that may be altered and/or optimized for reliability, warpage reduction, etc. In some embodiments, package substrate 504 may be composed of a polymer, ceramic, glass, or semiconductor material. In some embodiments, package substrate 504 may be a conventional cored substrate and/or an interposer.

In some embodiments, circuit board 522 may be a Printed Circuit Board (PCB) composed of an electrically insulative material such as an epoxy laminate. For example, circuit board 522 may include electrically insulating layers composed of materials such as, for example, polytetrafluoroethylene, phenolic cotton paper materials such as Flame Retardant 4 (FR-4), FR-1, cotton paper and epoxy materials such as GEM-1 or CEM-3, or woven glass materials that are laminated together using an epoxy resin prepreg material.

Structures such as traces, trenches, and vias (which are not shown here) may be formed through the electrically insulating layers to route the electrical signals of First die 501 through the circuit board 522. Circuit board 522 may be composed of other suitable materials in other embodiments. In some embodiments, circuit board 522 may include other electrical devices coupled to the circuit board that are configured to route electrical signals to or from First die 501 through circuit board 522. In some embodiments, circuit board 522 may be a motherboard.

In some embodiments, a first side of package substrate 504 is coupled to second surface S2 and/or electrical routing features 506 of First die 501. In some embodiments, a second opposite side of package substrate 504 is coupled to circuit board 522 by package interconnects 512. In some embodiments, package interconnects 512 may couple electrical routing features 510 disposed on the second side of package substrate 504 to corresponding electrical routing features 516 on circuit board 522.

In some embodiments, package substrate 504 may have electrical routing features formed therein to route electrical signals between First die 501 (and/or the Second die 502) and circuit board 522 and/or other electrical components external to the IC package assembly. In some embodiments, package interconnects 512 and die interconnects 506 include any of a wide variety of suitable structures and/or materials including, for example, bumps, pillars or balls formed using metals, alloys, solderable material, or their combinations. In some embodiments, electrical routing features 510 may be arranged in a ball grid array ("BGA") or other configuration.

In some embodiments, backside of Second die 502 is laminated with DBF 102 followed by coating of a layer of fluorocarbon 201. In some embodiments, the package assembly that contains the elements of cross-section 500, is coated with layer of fluorocarbon 201 as shown by the staircase coating of fluorocarbon. In this form, in accordance with some embodiments, the fluorocarbon coating 201 dramatically reduces electrical failures along all the current carrying portion of the devices due to ingress of moisture and pollutant gases in the field as well as during reliability testing.

Figure 6:
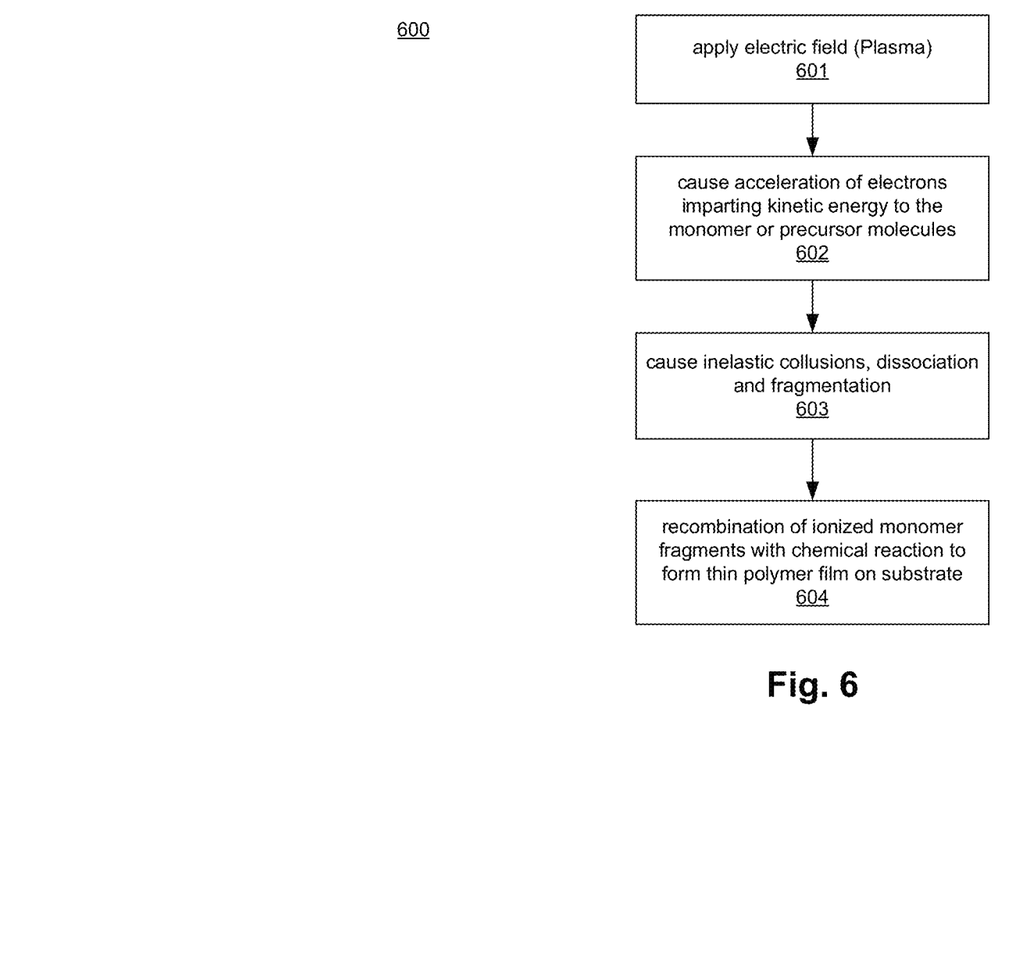
FIG. 6 illustrates a flowchart of a method of forming a thin polymer film of fluorocarbon, in accordance with some embodiments.

FIG. 6 illustrates flowchart 600 of a method of forming a thin polymer film of fluorocarbon 201, in accordance with some embodiments. It is pointed out that those elements of FIG. 6 having the same reference numbers (or names) as the elements of any other figure can operate or function in any manner similar to that described, but are not limited to such.

Although the blocks in the flowchart with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

The process of flowchart 600 is a Plasma Polymerization process which produces an ultra-thin, durable, and pin-hole free polymer layer with defined and regular structure, in accordance with some embodiments. At block 601, an electric field is applied. The electric field is applied via coils around a chamber having gases (e.g., mixer of fluorocarbon and argon gas). At block 602, the electric field causes gases inside the chamber to excite. As such, electrons in the chamber accelerate such that the electrons impart kinetic energy to the monomer or precursor molecules. At block 603, the monomer or precursor molecules collide with each other resulting in inelastic collisions, dissociation, and fragmentation. At block 604, the process of recombination occurs and ionized monomer fragments are recombined with chemical reactions to form a thin polymer film on the surface of a substrate (e.g., DBF).

Figure 7:
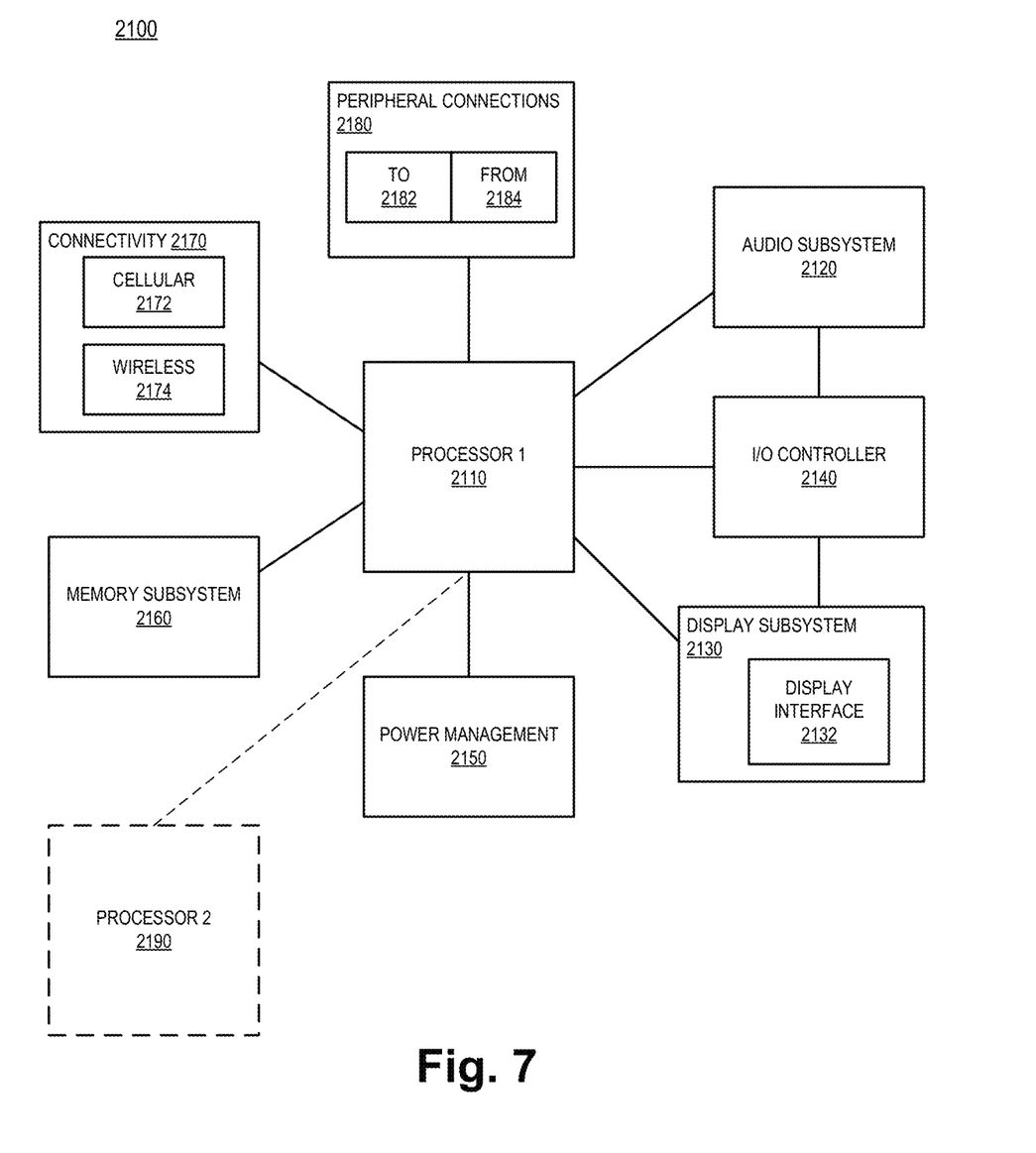
FIG. 7 illustrates a smart device or a computer system or a SoC (System-on-Chip) which is packaged with a layer of fluorocarbon on a DBF, according to some embodiments.

FIG. 7 illustrates a smart device or a computer system or a SoC (System-on-Chip) 2100 which is later packaged with a layer of fluorocarbon 201 on a DBF 102 and/or coating a layer of fluorocarbon 201 without first laminating DBF 102. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 (e.g., First die 501). The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190, e.g., Second die 502) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a die having a first side and a second side opposite to the first side; a die backside film (DBF) or a die attach film (DAF) disposed over the first side of the die; and a fluorocarbon layer disposed over the DBF or DAF. In some embodiments, the fluorocarbon layer is formed of at least one of: $CF_4$, $CHF_3$, $C_2F_6$, $C_2F_8$ or any organic monomer containing fluoro group. In some embodiments, the thickness of the fluorocarbon layer is less than 10 nm. In some embodiments, the DBF is formed of at least one of: epoxy, epoxy-acrylate, acrylic resin based, epoxy-maleimides, polyimide, or vinyl ester.

In some embodiments, the apparatus comprises a cover tape applied over the fluorocarbon layer. In some embodiments, the second side of the die has bumps for electrically coupling to a package. In some embodiments, the die includes one or more processing cores.

In another example, a system is provided which comprises: a memory; a processor coupled to the memory; a package encasing the processor, the package including an apparatus according to the apparatus described above; and a wireless interface for allowing the processor to communicate with another device.

In another example, a method is provided which comprises applying a die backside film (DBF) over a first side of a die, wherein the die has a second side which metal bumps; and applying a plasma polymerization process to treat the DBF with a fluorocarbon plasma. In some embodiments, applying the plasma polymerization process comprises treating the DBF with at least one of: $CF_4$, $CHF_3$, $C_2F_6$, $C_2F_8$ or any organic monomer containing fluoro group gases in a vacuum chamber.

In some embodiments, the method comprises curing the first side of the die after applying the plasma polymerization process. In some embodiments, the fluorocarbon plasma forms a layer over the DBF, and wherein the layer has a thickness in the range of 1 nm to 10 nm. In some embodiments, the method comprises applying a cover tape over the layer.

In another example, a apparatus is provided which comprises: a die having a first side and a second side opposite to the first side; a die attach film (DAF) disposed over the first side of the die; and a fluorocarbon layer disposed over the DAF. In some embodiments, the fluorocarbon layer is formed of at least one of: $CF_4$, $CHF_3$, $C_2F_6$, $C_2F_8$ or any organic monomer containing fluoro group. In some embodiments, the thickness of the fluorocarbon layer is less than 10 nm.

In some embodiments, the DAF is formed of at least one of: epoxy, epoxy-acrylate, acrylic resin based, epoxy-maleimides, polyimide, or vinyl ester. In some embodiments, the fluorocarbon layer is coupled to a surface of another die. In some embodiments, the second side of the die has bumps for electrically coupling to a package.

In another example, a system is provided which comprises: a memory; a processor coupled to the memory; a package encasing the processor, the package including an apparatus according to the apparatus described above; and a wireless interface for allowing the processor to communicate with another device.

In another example, an apparatus is provided which comprises: means for applying a die backside film (DBF) over a first side of a die, wherein the die has a second side which metal bumps; and means for applying a plasma polymerization process to treat the DBF with a fluorocarbon plasma. In some embodiments, the means for applying the plasma polymerization process comprises means for treating the DBF with at least one of: $CF_4$, $CHF_3$, $C_2F_6$, $C_2F_8$ or any organic monomer containing fluoro group gases in a vacuum chamber.

In some embodiments, the apparatus comprises means for curing the first side of the die after applying the plasma polymerization process. In some embodiments, the fluorocarbon plasma forms a layer over the DBF, and wherein the layer has a thickness in the range of 1 nm to 10 nm. In some embodiments, the apparatus comprises means for applying a cover tape over the layer.

In another example, a machine readable storage media is provided having instructions stored there on that, when executed, cause one or more processors to perform an operation comprising: apply a die backside film (DBF) over a first side of a die, wherein the die has a second side which metal bumps; and apply a plasma polymerization process to treat the DBF with a fluorocarbon plasma. In some embodiments, the operation to apply the plasma polymerization process comprises the operation to treat the DBF with at least one of: $CF_4$, $CHF_3$, $C_2F_6$, $C_2F_8$ or any organic monomer containing fluoro group gases in a vacuum chamber.

In some embodiments, the machine readable storage media has instructions stored there on that, when executed, cause the one or more processors to perform an operation comprising curing the first side of the die after applying the plasma polymerization process. In some embodiments, the fluorocarbon plasma forms a layer over the DBF, and wherein the layer has a thickness in the range of 1 nm to 10 nm. In some embodiments, the machine readable storage media has instructions stored there on that, when executed, cause the one or more processors to perform an operation comprising apply a cover tape over the layer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a die having a first side and a second side opposite to the first side;
   a die backside film (DBF) or a die attach film (DAF) over the first side of the die;
   a fluorocarbon layer over the DBF or DAF; and
   a cover tape over the fluorocarbon layer, wherein the cover tape comprises an adhesive material.

2. The apparatus of claim 1, wherein the fluorocarbon layer comprises at least one of: C, H, or F.

3. The apparatus of claim 1, wherein the thickness of the fluorocarbon layer is less than 10 nm.

4. The apparatus of claim 1, wherein the DBF comprises at least one of: epoxy, epoxy-acrylate, acrylic resin based, epoxy-maleimides, polyimide, or vinyl ester.

5. The apparatus of claim 1, wherein the second side of the die has bumps to electrically couple to a package.

6. The apparatus of claim 1, wherein the die includes one or more processing cores.

7. An apparatus comprising:
   a die having a first side and a second side opposite to the first side;
   a die attach film (DAF) over the first side of the die; and
   a fluorocarbon layer over the DAF, wherein the thickness of the fluorocarbon layer is less than 8 nm.

8. The apparatus of claim 7, wherein the fluorocarbon layer comprises at least one of: C, H, or F.

9. The apparatus of claim 7, wherein the DAF is of at least one of: epoxy, epoxy-acrylate, acrylic resin based, epoxy-maleimides, polyimide, or vinyl ester.

10. The apparatus of claim 7, wherein the fluorocarbon layer is coupled to a surface of another die.

11. The apparatus of claim 7, wherein the second side of the die has bumps to electrically couple to a package.

12. A system comprising:
a memory;
a processor coupled to the memory;
a package encasing the processor, the package including an apparatus which comprises:
a die having a first side and a second side opposite to the first side;
a die backside film (DBF) or a die attach film (DAF) over the first side of the die;
a fluorocarbon layer over the DBF or DAF; and
a cover tape over the fluorocarbon layer, wherein the cover tape comprises an adhesive material; and
a wireless interface to allow the processor to communicate with another device.

13. The system of claim 12, wherein the fluorocarbon layer comprises at least one of: C, H, or F.

* * * * *